US006744633B1

(12) United States Patent
Dials et al.

(10) Patent No.: US 6,744,633 B1
(45) Date of Patent: Jun. 1, 2004

(54) CARD INSULATOR AND RETENTION GUIDE FOR A COMPUTER SYSTEM HAVING HOT PLUGABLE ADAPTER CARDS

(75) Inventors: Edward N. Dials, Apex, NC (US);
Cynthia M. Grosser, Apex, NC (US);
Kevin D. Johnson, Apex, NC (US);
Mark E. Maresh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 09/666,491

(22) Filed: Sep. 18, 2000

(51) Int. Cl.[7] .............................. H05K 5/00; H05K 5/04; H05K 5/06
(52) U.S. Cl. ..................... 361/752; 361/759; 361/801
(58) Field of Search ................................ 361/800–802, 361/752–759, 798, 796, 799; 206/706; 211/41.17, 26; 439/61, 64

(56) References Cited

U.S. PATENT DOCUMENTS

| | | | | |
|---|---|---|---|---|
| 5,982,627 A | * | 11/1999 | Haughton et al. | 206/706 |
| 6,118,667 A | * | 9/2000 | Grosser et al. | 361/683 |
| 6,122,176 A | * | 9/2000 | Clements | 361/752 |
| 6,169,662 B1 | * | 1/2001 | Clark et al. | 206/706 |
| 6,250,932 B1 | * | 6/2001 | Smith et al. | 439/61 |
| 6,671,181 B2 | * | 12/2003 | Kaminski | 361/759 |

* cited by examiner

Primary Examiner—Carl Whitehead, Jr.
Assistant Examiner—Tuan Dinh
(74) Attorney, Agent, or Firm—Sawyer Law Group

(57) ABSTRACT

The present invention is an information processing system. The information system comprises a housing, a card insulator, and a card insulator guide. The card insulator comprises a planar portion, a handle portion coupled to the planar portion, the handle portion including a securing element for securing the card insulator to the housing. The card insulator guide is coupled to the housing wherein the card insulator guide comprises at least one slot for receiving the card insulator and a retainer lid hingedly coupled to the at least one slot for securing the card insulator to the card insulator guide. Through the use of the system in accordance with the present invention, the card insulator is coupled to the information processing system in a more secure fashion thereby preventing the card insulator from popping out of position as a result a shock or vibration to the information processing system.

4 Claims, 6 Drawing Sheets

CARD INSULATOR AND RETENTION GUIDE FOR A COMPUTER SYSTEM HAVING HOT PLUGABLE ADAPTER CARDS

FIELD OF INVENTION

The present invention relates generally to computer systems and particularly to a card insulator and retention guide for a computer system having hot plugable adapter cards.

BACKGROUND OF THE INVENTION

Computer systems usually have a main printed circuit board commonly called the "motherboard". The motherboard is usually equipped with a plurality of card edge connectors for receiving adapter cards. These adapter cards are designed to provide optional and additional functions that the base system on the motherboard does not provide. In many computer systems, the insertion or the removal of an adapter card requires that the power to the system be turned off. However, in more advanced systems, adapter cards can be plugged into and unplugged from the system while the power to the system is ON. Plugging an adapter card into or removing it from a system while the power is ON is generally referred to as "hot-plugging".

Since most adapter cards have a metal bracket at one edge of the card, and because the power to the motherboard is not turned OFF in a "hot-plug" system during insertion or removal of an adapter card, the accidental contact of the metal bracket to the motherboard can result in an electrical short. In addition, during insertion or removal of an adapter card, the accidental contact of an adapter card to an adjacent adapter card already installed in the system can also result in an electrical short.

A typical solution to this problem involves covering the motherboard with a large sheet of semi-rigid plastic. The adapter card connectors on the motherboard are accessible to the edge connector of an adapter card through a plurality of slots in the motherboard insulator. Positioned between each of these slots in the motherboard insulator is a mechanical connector. A substantially rectangular card insulator which is comprised of a thin sheet of semi-rigid plastic, is positioned between two adjacent adapter cards and attached to the mechanical connector on the motherboard insulator such that the card insulator is supported in a position substantially perpendicular position to the motherboard.

FIG. 1 shows a typical card insulator 10. The card insulator 10 comprises a first to planar portion 14 and a second planar portion 18. The first planar portion 14 comprises first edge and second opposing edges 12,20. A second planar portion 18 having a slot 16 is connected to the first planar portion 14 and extends substantially perpendicular to the first planar portion 14. The slot 16 connects to a piece of molded plastic (not shown) that is coupled to the motherboard.

A problem associated with these prior art solutions is that the card insulator 10 is not rigidly retained in its position during shock and vibration tests. Consequently, the card insulator would tend to pop out during shock and vibration tests. Furthermore, the piece of molded plastic required to connect the card insulator 10 adds a significant expense to the system since it is system specific.

Accordingly, what is need is an improved system for retaining a card insulator within a processing system. The improvement should be simple, cost effective and capable of being easily adapted to current technology. The present invention addresses such a need.

SUMMARY OF THE INVENTION

The present invention is an information processing system. The information system comprises a housing, a card insulator, and a card insulator guide. The card insulator comprises a planar portion, a handle portion coupled to the planar portion, the handle portion including a securing element for securing the card insulator to the housing. The card insulator guide is coupled to the housing wherein the card insulator guide comprises at least one slot for receiving the card insulator and a retainer lid hingedly coupled to the at least one slot for securing the card insulator to the information processing system.

Through the use of the system in accordance with the present invention, the card insulator is coupled to the information processing system in a more secure fashion thereby preventing the card insulator from popping out of position as a result a shock and/or vibration to the information processing system.

DETAILED DESCRIPTION OF THE INVENTION

The present invention provides a card insulator and retention guide for a computer system having hot pluggable adapter cards. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The present invention is presented in the context of a preferred embodiment. The preferred embodiment of the present invention is a system for retaining a card insulator within an information processing system. Through the use of the system in accordance with the present invention, the card insulator is coupled to the information processing system in a more secure fashion thereby preventing the card insulator from popping out of position as a result a shock or vibration to the information processing system.

Figure 1:
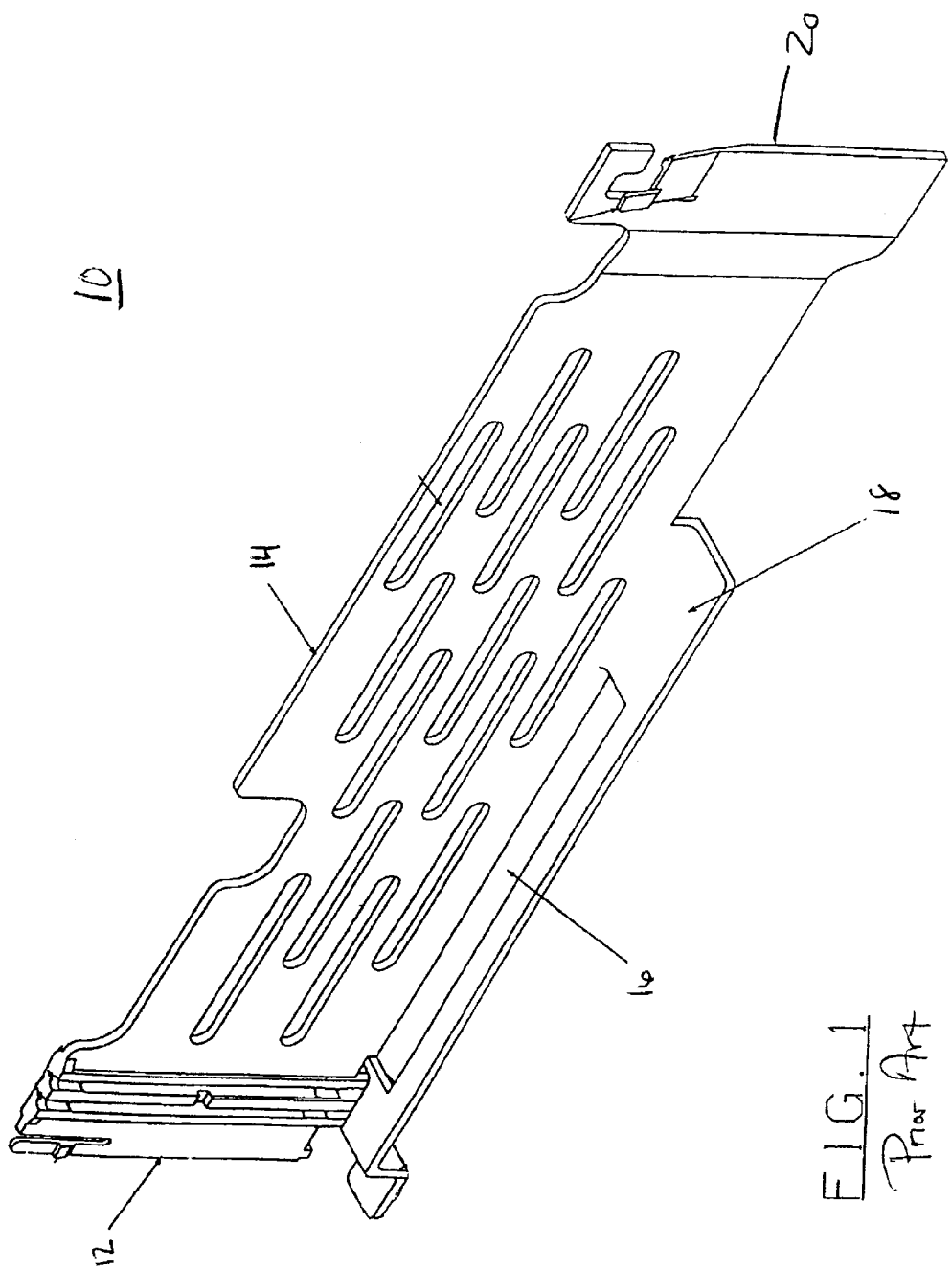
FIG. 1 shows a typical card insulator.
Figure 2:
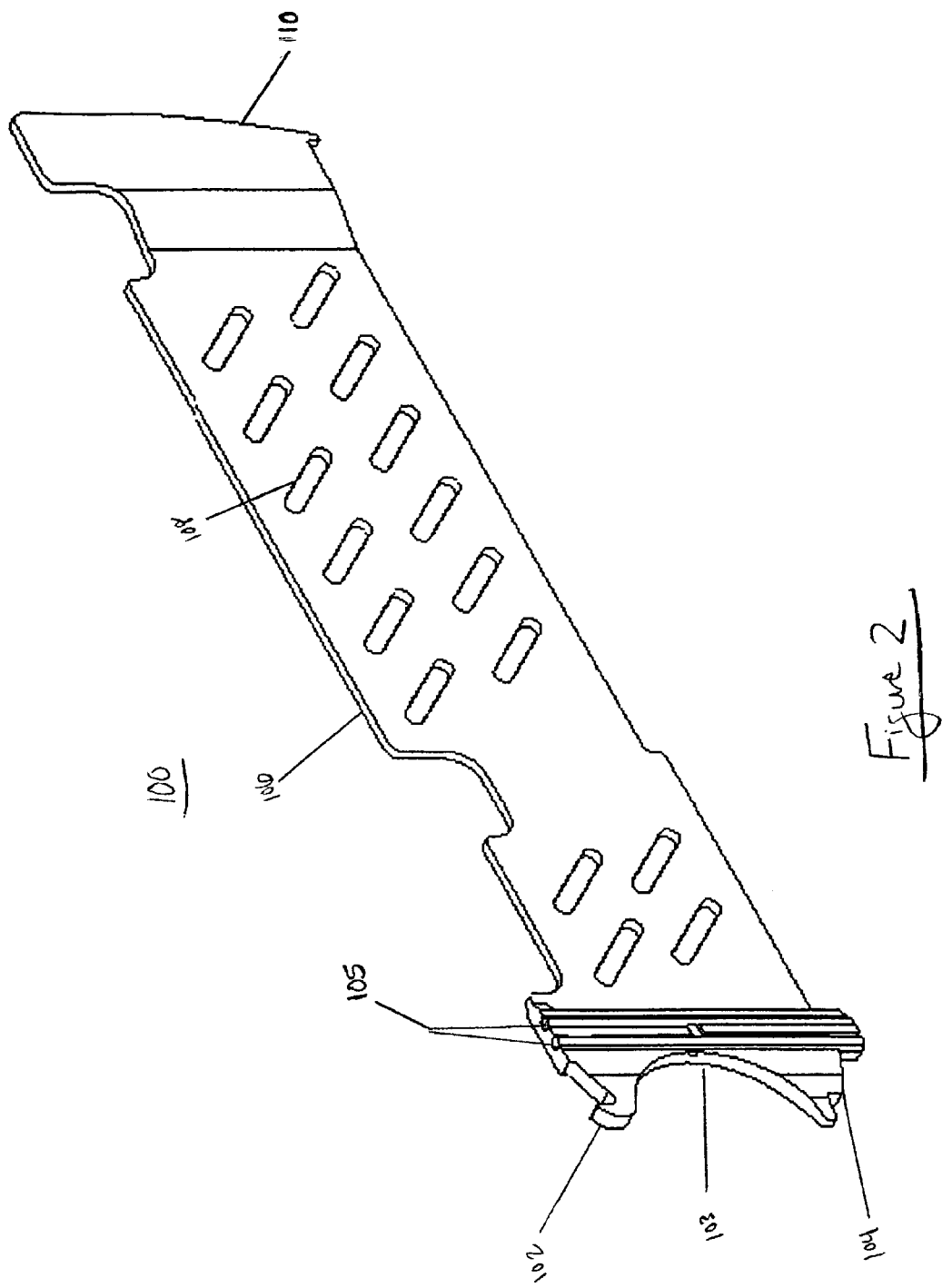
FIG. 2 is an isometric view of a card insulator in accordance with the present invention.

A preferred embodiment of a system in accordance with the present invention comprises a card insulator and a retention guide. FIG. 2 is an isometric view of a card insulator 100 in accordance with the present invention. The card insulator 100 includes a planar portion 106 having a plurality of thermal slots 108. When installed in an information processing system, the thermal slots 108 permit air to flow through the card insulator 100 thereby facilitating cooling. The card insulator 100 also includes a handle portion 104 coupled to the planar portion 106, grooves 105 coupled to the handle portion 104, and an end portion 110 coupled to the planar portion 106.

The handle portion 104 comprises a connecting element 102. The connecting element 102 is preferably hooked in order to facilitate the secure installation of the card insulator 100 into an information processing system. Also, the handle portion 104 preferably includes a curved portion 103 to facilitate easier installation of the card insulator 100.

Although the preferred embodiment of the present invention is described in the context of being utilized with a curved handle portion, one of ordinary skill in the art will readily recognize that a non-curved handle portion could also be employed while remaining within the spirit and scope of the present invention.

Figure 3:
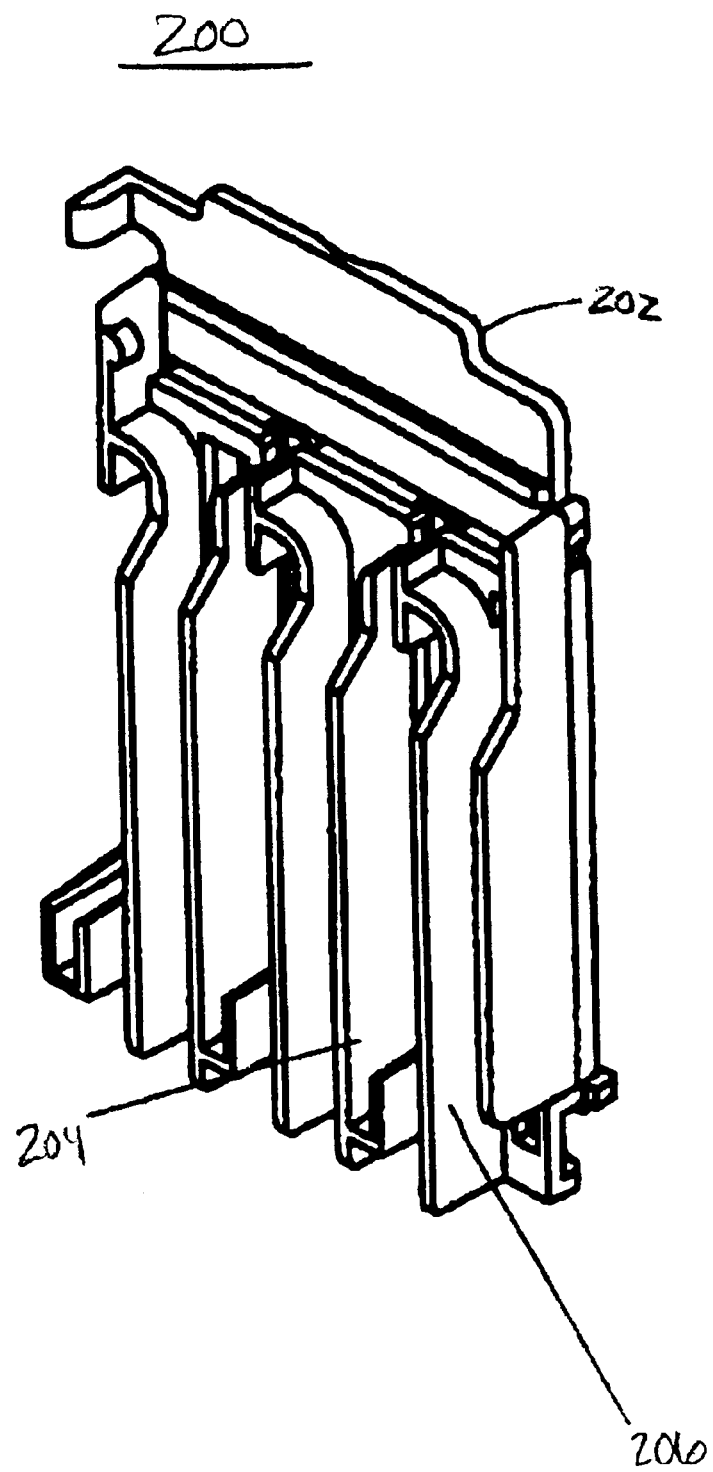
FIG. 3 is an isometric view of the retention guide in accordance with the present invention.

Please refer now to FIG. 3. FIG. 3 is an isometric view of the retention guide 200 in accordance with the present invention. The retention guide 200 comprises a retainer lid 202, a plurality of adapter card slots 204 and a plurality of card insulator slots 206. Each of the adapter card slots 204 are designed to support an adapter card (not shown) and are directly adjacent to each card insulator slot 206. Each card insulator slot 206 is designed to support a card insulator 100 via the end portion 110. Because each card insulator slot 206 supports the entire end portion 110 of the card insulator 100, a side to side shock and/or vibration is less likely to cause the card insulator 100 to pop out of the slot 206.

Figure 4:
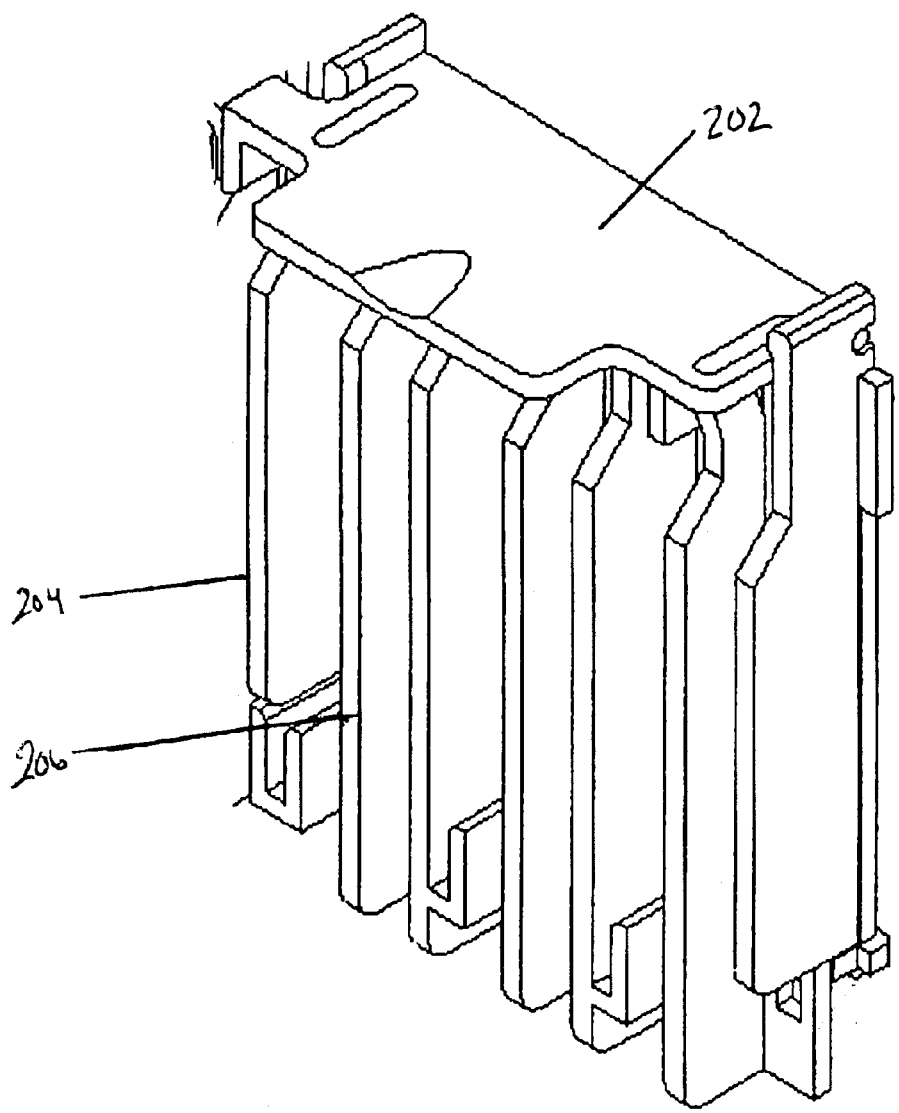
FIG. 4 shows the horizontal closed position of the retainer lid.

The retainer lid 202 is hingedly coupled to the slots 204, 206. The retainer lid 202 preferably has two positions, an open position and a closed position. In the open position (shown in FIG. 3) the retainer lid 202 is vertical. This facilitates the insertion of adapter cards and card insulators. From the open position, the retainer lid 202 is hingedly rotated approximately ninety (90) degrees to a horizontal closed position. The horizontal closed position of the retainer lid 202 is shown in FIG. 4. By closing the retainer lid 202 once the adapter cards and card insulators have been inserted into the retention guide 200, the adapter cards as well as the card insulators are prevented from popping out of their respective slots as a result of a up/down shock and/or vibration to the system in which they are utilized.

Figure 5:
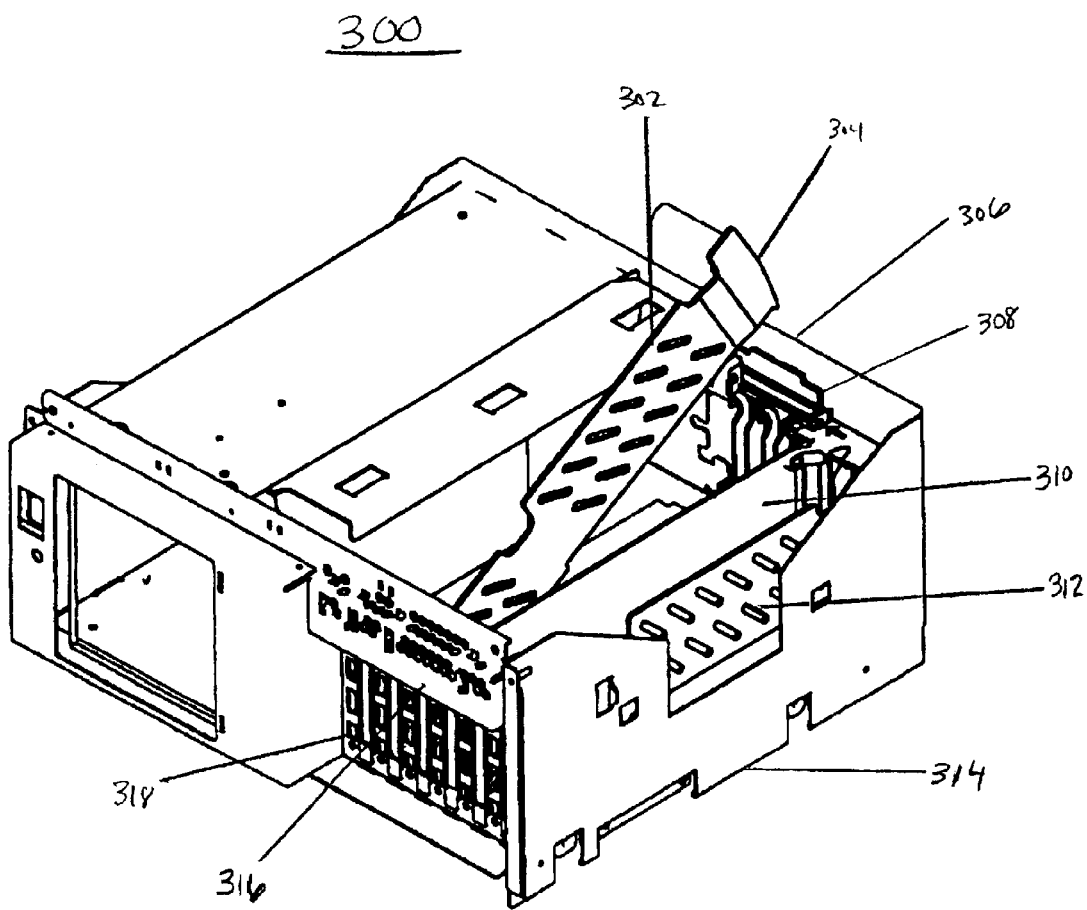
FIG. 5 is an isometric view an information processing system in accordance with the present invention.

Please refer now to FIG. 5. FIG. 5 is an isometric view an information processing system 300 in accordance with the present invention. The system 300 comprises a housing 314 wherein the housing 314 includes a first side 306 and a second side 316. A retention guide 308 in accordance with the present invention is coupled to the first side 306 and a steel chassis 318 is coupled to the second side 316. FIG. 5 shows an inserted adapter card 310 and a first card insulator 312. FIG. 5 also shows a second card insulator 302 in the process of being inserted into the retention guide 306 via the end portion 304.

Figure 6:
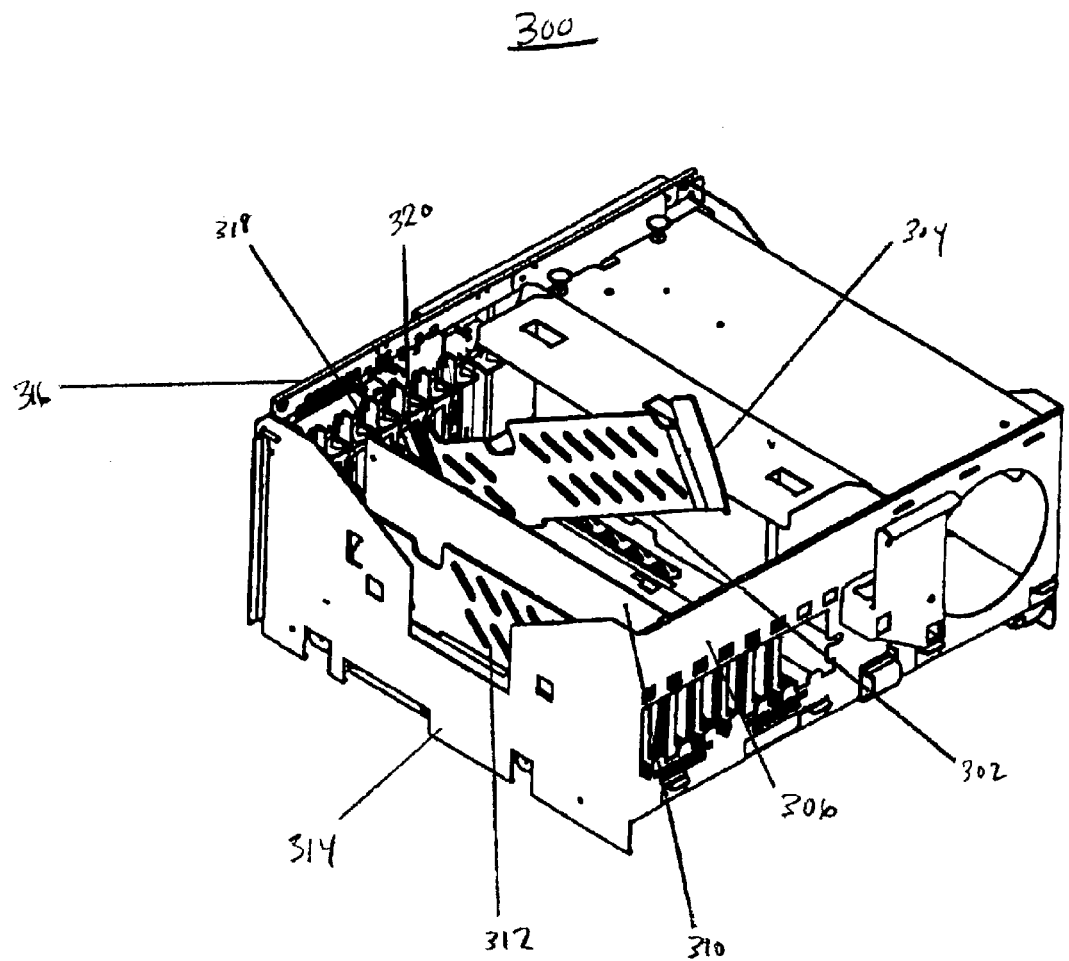
FIG. 6 is a rotated view of the information processing system in accordance with the present invention.

For a further illustration of the present invention, please refer now to FIG. 6. FIG. 6 is a rotated view of the system 300. In FIG. 6, it is observed that the handle portion 320 of the second card insulator 302 is coupled to the steel chassis 318. In accordance with the present invention the insulator 302 is coupled to the chassis 318 via a hooked connecting element thereby keeping the insulator 302 retained in its position in the event of a shock and/or vibration to the system 300.

Based on the addition of the hooked connecting element, in combination with the retention guide, the card insulator in accordance with the present invention is coupled to the information processing system in a more secure fashion thereby preventing the card insulator from popping out of position as a result a shock and/or vibration to the information processing system.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A information processing system comprising:

a housing having a first and second side wherein the first side is opposite the second side;

a card insulator, the card insulator comprising:
a single planar portion; and
a curved handle portion coupled to the single planar portion, the curved handle portion including a hooked element for coupling the card insulator to the first side of the housing; and a retainer guide, the retainer guide coupled to the second side of the housing, the retainer guide comprising;
at least one slot for receiving the card insulator; and
a retainer lid hingedly coupled to the at least one slot for securing the card insulator to the information processing system and hingedly rotating from an open position to a closed position.

2. The information processing system of claim 1 wherein the first side of the housing comprises a chassis and the handle portion is coupled to the chassis via the hooked connecting element.

3. The information processing system of claim 2 wherein the card insulator comprises an end portion and the at least one slot supports the entire end portion.

4. An information processing system comprising:

a housing having a first and second side wherein the first side comprises a chassis and is opposite the second side;

a card insulator, the card insulator comprising:
a single planar portion; and
a curved handle portion coupled to the single planar portion, the curved handle portion including a hooked element for coupling the card insulator to the chassis; and
an end portion coupled to the single planar portion; and a retainer guide, the retainer guide coupled to the second side of the housing, the retainer guide comprising;
at least one slot for receiving the entire end portion of the card insulator, and a retainer lid hingedly coupled to the at least one slot for securing the card insulator to the information processing system wherein the retainer lid hingedly rotates from an open position to a closed position.

* * * * *